US010553292B1

(12) United States Patent
Jung et al.

(10) Patent No.: US 10,553,292 B1
(45) Date of Patent: Feb. 4, 2020

(54) MEMORY SYSTEM WITH MEMORY REGION READ COUNTS AND A MEMORY GROUP READ COUNT AND OPERATING METHOD THEREOF

(71) Applicant: SK hynix Inc., Gyeonggi-do (KR)

(72) Inventors: Yong Il Jung, Gyeonggi-do (KR); Dae Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/221,956

(22) Filed: Dec. 17, 2018

(30) Foreign Application Priority Data

Aug. 8, 2018 (KR) .......................... 10-2018-0092542

(51) Int. Cl.
G11C 16/34 (2006.01)
G06F 11/10 (2006.01)
G11C 29/50 (2006.01)
G11C 16/10 (2006.01)
G06F 12/02 (2006.01)

(52) U.S. Cl.
CPC ...... G11C 16/3422 (2013.01); G06F 11/1072 (2013.01); G06F 12/0246 (2013.01); G11C 16/102 (2013.01); G11C 16/349 (2013.01); G11C 29/50004 (2013.01)

(58) Field of Classification Search
None
See application file for complete search history.

(56) References Cited

U.S. PATENT DOCUMENTS 7,818,525 B1* 10/2010 Frost ................... G06F 12/0246
365/185.25
9,785,550 B1* 10/2017 Kim ................... G06F 12/0246
2009/0125671 A1* 5/2009 Flynn ........................ G06F 9/52
711/103
2013/0258770 A1* 10/2013 Goss ...................... G11C 16/26
365/185.02
2015/0169403 A1* 6/2015 Yen ...................... G06F 11/1048
714/760
2015/0262714 A1 9/2015 Tuers et al.
2016/0098201 A1* 4/2016 Kim ........................ G06F 11/10
711/103
2016/0155516 A1* 6/2016 Chang ................... G06F 12/023
2017/0206032 A1* 7/2017 Son ....................... G06F 3/0604
2018/0373460 A1* 12/2018 Park ....................... G06F 3/0619
2018/0374549 A1* 12/2018 Padilla ............... G11C 16/3427

FOREIGN PATENT DOCUMENTS

KR 1020180014975 2/2018

* cited by examiner

Primary Examiner — J. H. Hur
(74) Attorney, Agent, or Firm — IP & T Group LLP

(57) ABSTRACT

A memory system includes a storage medium including a memory region group having a plurality of memory regions; a memory configured to store a plurality of region read counts respectively corresponding to the plurality of memory regions and a group read count corresponding to the memory region group; a count management circuit configured to, when a first memory region among the plurality of memory regions is read-accessed, based on a first region read count corresponding to the first memory region among the plurality of region read counts, increase the group read count and reduce remaining region read counts other than the first region read count among the plurality of region read counts; and a reliability management circuit configured to perform a reliability management operation for the memory region group, based on the group read count.

20 Claims, 5 Drawing Sheets

MEMORY SYSTEM WITH MEMORY REGION READ COUNTS AND A MEMORY GROUP READ COUNT AND OPERATING METHOD THEREOF

CROSS-REFERENCES TO RELATED APPLICATION

The present application claims priority under 35 U.S.C. § 119(a) to Korean application number 10-2018-0092542, filed on Aug. 8, 2018, which is incorporated herein by reference in its entirety.

BACKGROUND

1. Technical Field

Various embodiments generally relate to a memory system, and, more particularly, to a memory system including a nonvolatile memory device.

2. Related Art

A memory system may be configured to store the data provided from a host device, in response to a write request from the host device. Also, the memory system 100 may be configured to provide stored data to the host device, in response to a read request of the host device. The host device may be an electronic device capable of processing data and may include a computer, a digital camera or a mobile phone. The memory system may operate by being built in the host device, or may operate by being manufactured in a separable form and being coupled to the host device.

SUMMARY

In an embodiment, a memory system may include: a storage medium including a memory region group having a plurality of memory regions; a memory configured to store a plurality of region read counts respectively corresponding to the plurality of memory regions and a group read count corresponding to the memory region group; a count management circuit configured to, when a first memory region among the plurality of memory regions is read-accessed, based on a first region read count corresponding to the first memory region among the plurality of region read counts, increase the group read count and reduce remaining region read counts other than the first region read count among the plurality of region read counts; and a reliability management circuit configured to perform a reliability management operation for the memory region group, based on the group read count.

In an embodiment, a method for operating a memory system may include: read-accessing a first memory region among a plurality of memory regions included in a memory region group; based on a first region read count corresponding to the first memory region among a plurality of region read counts respectively corresponding to the plurality of memory regions, increasing a group read count of the memory region group and reducing remaining region read counts other than the first region read count among the plurality of region read counts; and performing a reliability management operation for the memory region group, based on the group read count.

In an embodiment, a memory system may include: a memory device including at least a memory region group having first and second memory regions; and a controller configured to: increase a group read count for the memory region group by a preset amount while decreasing a second region read count for the second memory region by the preset amount when a first region read count for the first memory region reaches a first threshold due to a read-access to the first memory region; and control the memory device to move valid data of the memory region group into another memory region when the group read count reaches a second threshold.

DETAILED DESCRIPTION

Figure 1:
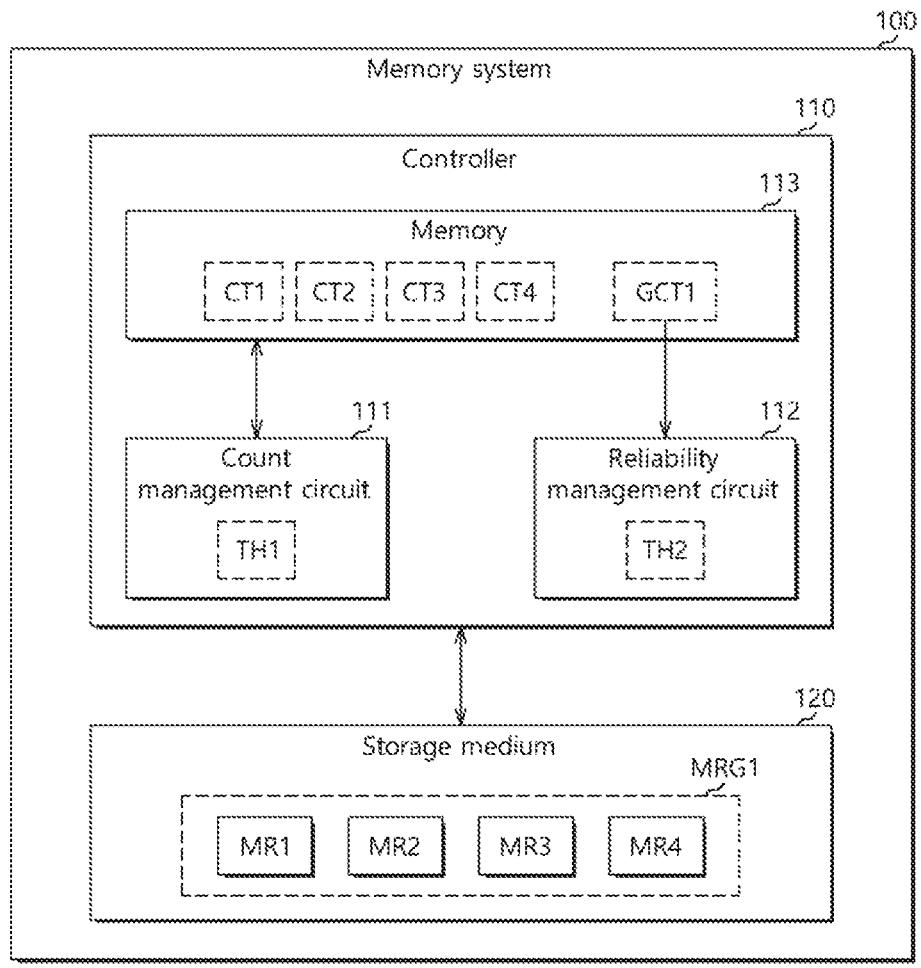
FIG. 1 is a block diagram illustrating a memory system in accordance with an embodiment.

Hereinafter, a memory system and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a memory system 100 in accordance with an embodiment.

The memory system 100 may be configured to store data provided from an external host device, in response to a write request of the host device. Also, the memory system 100 may be configured to provide stored data to the host device, in response to a read request of the host device.

The memory system 100 may be configured by a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 100 may include a controller 110 and a storage medium 120.

The controller 110 may control general operations of the memory system 100. The controller 110 may access the storage medium 120 to process a request of the host device. Also, the controller 110 may access the storage medium 120 to perform an internal management operation or a background operation of the memory system 100 regardless of a request of the host device. An access to the storage medium 120 may include a write access and a read access. That is, the controller 110 may write-access and read-access the storage medium 120 by controlling a write operation and a read operation of the storage medium 120.

The controller 110 may include a count management circuit 111, a reliability management circuit 112 and a memory 113.

The count management circuit 111 may manage region read counts CT1 to CT4 and a group read count GCT1 stored in the memory 113. The group read count GCT1 may correspond to a memory region group MRG1 included in the storage medium 120, and the region read counts CT1 to CT4 may respectively correspond to memory regions MR1 to MR4 included in the memory region group MRG1.

For example, when a first memory region MR1 among the memory regions MR1 to MR4 is read-accessed, the count management circuit 111 may increase the group read count GCT1 and may reduce the remaining region read counts CT2 to CT4 other than the first region read count CT1 among the read counts CT1 to CT4, based on the first region read count CT1 corresponding to the read-access to the first memory region MR1.

In detail, when the first memory region MR1 is read-accessed and the first region read count CT1 has reached a first threshold value TH1, the count management circuit 111 may increase the group read count GCT1 and may reduce the remaining region read counts CT2 to CT4.

The first threshold value TH1 may be, for example, the maximum value of each of the region read counts CT1 to CT4 depending on a memory capacity allocated to each of the region read counts CT1 to CT4. For example, in the case where three bits are allocated to each of the region read counts CT1 to CT4, the first threshold value TH1 may be 7.

The count management circuit 111 may increase the group read count GCT1 by an adjustment value and may reduce the remaining region read counts CT2 to CT4 by the adjustment value. In other words, the increase value of the group read count GCT1 and the reduction value of the remaining region read counts CT2 to CT4 may be the same as each other. For example, the adjustment value may be 1. For another example, the adjustment value may be a minimum value other than 0 among the region read counts CT1 to CT4.

According to the embodiment, in order to reduce the remaining region read counts CT2 to CT4, the count management circuit 111 may once reduce all the region read counts CT1 to CT4 by the adjustment value and then increase only the first region read count CT1 by the adjustment value.

When the first memory region MR1 is read-accessed but the first region read count CT1 has not reached the first threshold value TH1, the count management circuit 111 may increase only the first region read count CT1.

The count management circuit 111 may initialize the region read counts CT1 to CT4 and the group read count GCT1 after the reliability management circuit 112 performs a reliability management operation as will be described later.

The reliability management circuit 112 may perform the reliability management operation for the memory region group MRG1, based on the group read count GCT1.

In detail, the reliability management circuit 112 may perform the reliability management operation for the memory region group MRG1, in the case where the group read count GCT1 has reached a second threshold value TH2. When performing the reliability management operation, the reliability management circuit 112 may move the valid data stored in the memory regions MR1 to MR4 to one or more other memory regions (not shown).

The second threshold value TH2 may be, for example, the maximum value of the group read count GCT1 depending on a memory capacity allocated to the group read count GCT1.

Since the data stored in a memory region may be damaged little by little by read accesses to the memory region, the reliability management circuit 112 may recover the reliability of the data by moving the data to another memory region based on a group read count GCT before the data is completely damaged.

The memory 113 may store the region read counts CT1 to CT4 respectively corresponding to the memory regions MR1 to MR4 and the group read count GCT1 corresponding to the memory region group MRG1. A memory capacity allocated to each of the region read counts CT1 to CT4 may be smaller than a memory capacity allocated to the group read count GCT1.

According to an embodiment, the first threshold value TH1 and the second threshold value TH2 may be stored in the memory 113.

The memory 113 may include a volatile memory device such as a Static Random Access Memory (SRAM), a Dynamic Random Access Memory (DRAM), and the like. According to an embodiment, the memory 113 may include a memory element such as a register, a flip-flop, a latch and the like.

The storage medium 120 may store data transmitted from the controller 110 and may read stored data and transmit read data to the controller 110, under the control of the controller 110. The storage medium 120 may include the memory region group MRG1 including the memory regions MR1 to MR4.

Figure 2:
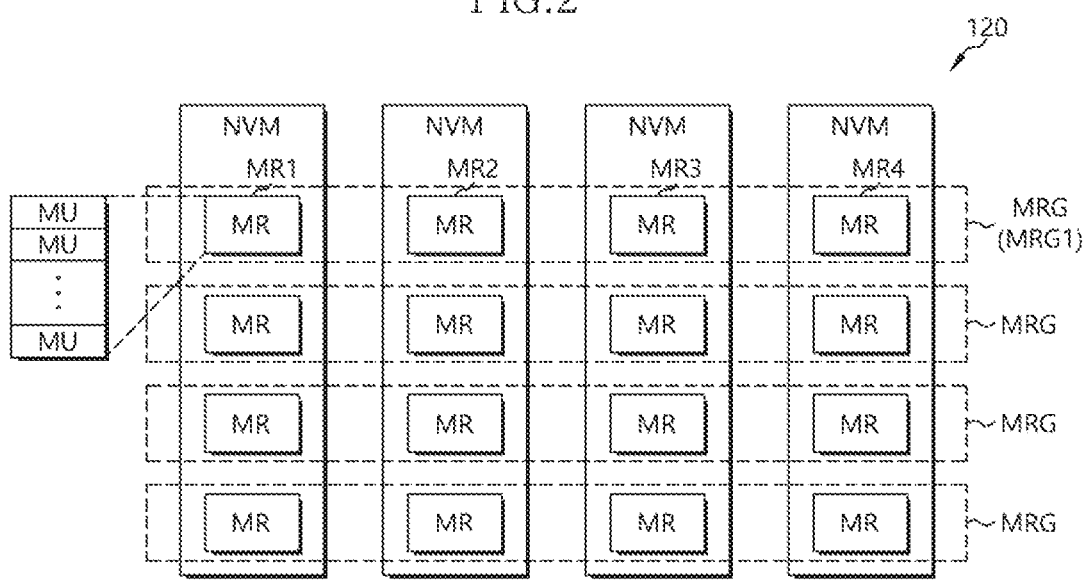
FIG. 2 is a block diagram illustrating the storage medium shown in FIG. 1.

FIG. 2 is a block diagram illustrating the storage medium 120 shown in FIG. 1.

Referring to FIG. 2, the storage medium 120 may include nonvolatile memory devices NVM. The controller 110 may access in parallel the nonvolatile memory devices NVM.

Each nonvolatile memory device NVM may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

Each nonvolatile memory device NVM may include memory regions MR. For example, each memory region MR may be a unit by which each nonvolatile memory device NVM performs an erase operation. In other words, the data stored in each memory region MR may be erased at once by the erase operation of each nonvolatile memory device NVM. For another example, each memory region MR may include at least two erase memory units each serving as a unit by which each nonvolatile memory device NVM performs an erase operation.

Each memory region MR may include a plurality of memory units MU. For example, each memory unit MU may be a unit by which each nonvolatile memory device NVM performs a read operation. In other words, the data stored in each memory unit MU may be read at once by the read operation of each nonvolatile memory device NVM.

Memory regions MR may be grouped into memory region groups MRG. The memory regions MR included in each memory region group MRG may be included in the nonvolatile memory devices NVM, respectively.

While not shown in FIG. 1, the memory 113 may store region read counts respectively corresponding to the memory regions MR of FIG. 2 and group read counts respectively corresponding to the memory region groups MRG of FIG. 2, and the count management circuit 111 may manage the region read counts and group read counts stored in the memory 113 in the same manner as described above for the region read counts CT1 to CT4 and the group read count GCT1 with reference to FIG. 1.

In summary, read-accessing a certain memory region MR may be read-accessing a target memory unit MU included in the corresponding memory region MR. When the target memory unit MU is read-accessed, in the case where the region read count CT of the memory region MR including the target memory unit MU has not reached the first threshold value TH1, the count management circuit 111 may increase the region read count CT of the corresponding memory region MR.

While it is illustrated in FIG. 2 that four nonvolatile memory devices NVM and four memory region groups MRG are provided and each memory region group MRG includes four memory regions MR, it is to be noted that the embodiment of the present disclosure is not limited thereto.

Figure 3:
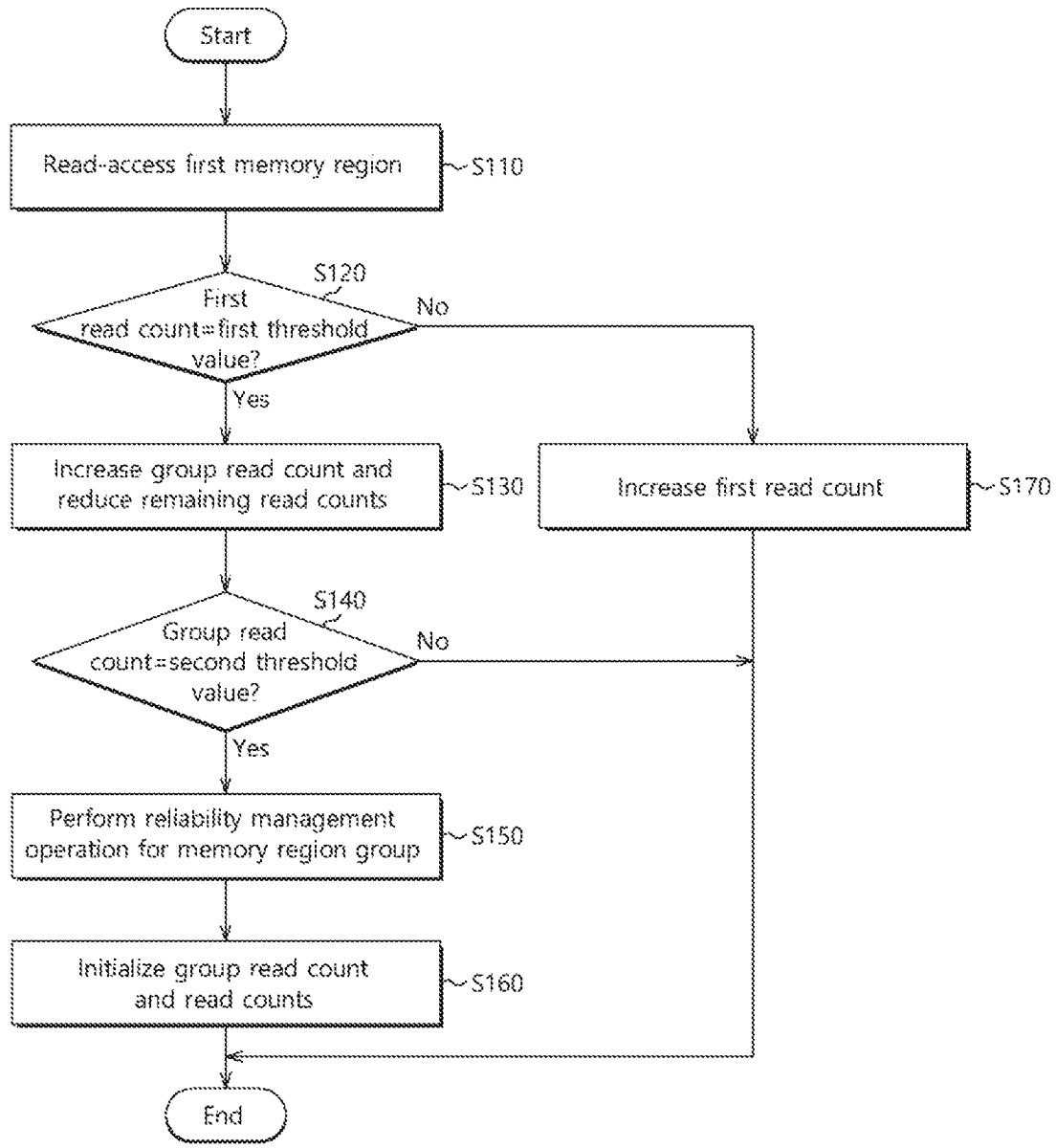
FIG. 3 is a flow chart of a method for operating the memory system of FIG. 1 in accordance with an embodiment.

FIG. 3 is a flow chart of a method for operating the memory system 100 of FIG. 1 in accordance with an embodiment.

Referring to FIG. 3, at step S110, the controller 110 may read-access the first memory region MR1 among the memory regions MR1 to MR4 included in the memory region group MRG1.

At step S120, the count management circuit 111 may determine whether the first region read count CT1, which corresponds to the first memory region MR1 among the region read counts CT1 to CT4 corresponding to the memory regions MR1 to MR4, has reached the first threshold value TH1. In the case where the first region read count CT1 has reached the first threshold value TH1, the process may proceed to step S130. In the case where the first region read count CT1 has not reached the first threshold value TH1, the process may proceed to step S170.

At the step S130, the count management circuit 111 may increase the group read count GCT1 corresponding to the memory region group MRG1 and reduce the remaining region read counts CT2 to CT4 other than the first region read count CT1. The count management circuit 111 may increase the group read count GCT1 by an adjustment value, and may reduce the remaining region read counts CT2 to CT4 by the adjustment value.

At step S140, the reliability management circuit 112 may determine whether the group read count GCT1 has reached the second threshold value TH2. In the case where the group read count GCT1 has reached the second threshold value TH2, the process may proceed to step S150. In the case where the group read count GCT1 has not reached the second threshold value TH2, the process may be ended.

At the step S150, the reliability management circuit 112 may perform a reliability management operation for the memory region group MRG1. When performing the reliability management operation, the reliability management circuit 112 may move the valid data stored in the memory regions MR1 to MR4 to one or more other memory regions MR1 to MR4.

At step S160, the count management circuit 111 may initialize the region read counts CT1 to CT4 and the group read count GCT1. Then, the process may be ended.

When it is determined at the step S120 that the first region read count CT1 has not reached the first threshold value TH1, the count management circuit 111 may increase the first region read count CT1 at the step S176. Then, the process may be ended.

Figure 4:
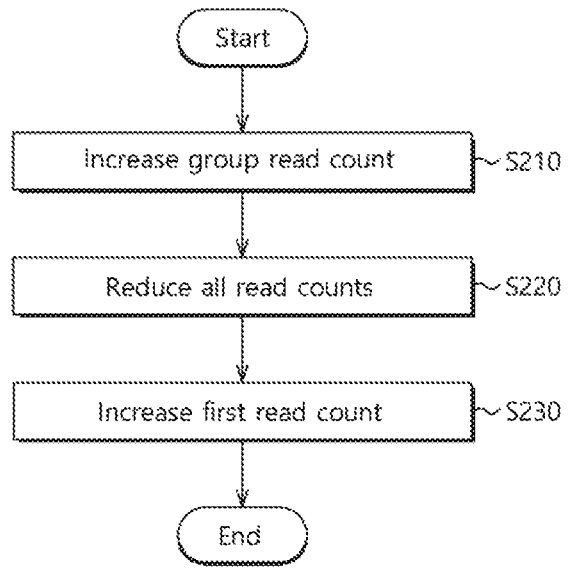
FIG. 4 is a flow chart of a method for operating the count management circuit of FIG. 1 in accordance with an embodiment.

FIG. 4 is a flow chart of a method for operating the count management circuit 111 of FIG. 1 in accordance with an embodiment. The process of FIG. 4 may be a detailed example of the step S130 of FIG. 3.

Referring to FIG. 4, at step S210, the count management circuit 111 may increase the group read count GCT1.

At step S220, the count management circuit 111 may reduce all the region read counts CT1 to CT4.

At step S230, the count management circuit 111 may increase only the first region read count CT1.

The count management circuit 111 may increase the group read count GCT1 by the adjustment value, may reduce all the region read counts CT1 to CT4 by the adjustment value, and may increase only the first region read count CT1 by the adjustment value.

In summary, according to the embodiment, the controller 110 may efficiently perform a reliability management operation while managing the region read counts CT1 to CT4 with a small memory capacity.

For example, if the region read counts CT1 to CT4 are not managed and only the group read count GCT1 is managed, read accesses to the memory regions MR1 to MR4 may not be properly reflected, and a reliability management operation may be performed even in a situation where it is not necessary. For example, in the case where sequential read operations for the memory regions MR1 to MR4 are performed, as each of the memory regions MR1 to MR4 is read-accessed only once, the group read count GCT1 may be increased by 4. Thus, a reliability management operation based on the group read count GCT1 may be performed too frequently.

Conversely, if the group read count GCT1 is not managed and only the region read counts CT1 to CT4 of the memory regions MR1 to MR4 are managed, a time at which data is damaged may be precisely grasped and a necessary reliability management operation may be performed. However, in this case, it may be necessary to allocate a substantially large memory capacity to the region read counts CT1 to CT4, to ensure that the region read counts CT1 to CT4 may be increased to an appropriate maximum value.

According to the embodiment of the present disclosure, a relatively small memory capacity may be allocated to the region read counts CT1 to CT4 of the memory regions MR1 to MR4. That is, the maximum value of each of the region read counts CT1 to CT4 may be relatively small. Nevertheless, since the region read counts CT1 to CT4 are reduced each time the group read count GCT1 is increased, no problem may be caused by the fact that the maximum value is small.

As the region read counts CT1 to CT4 are reduced each time the group read count GCT1 is increased, since an unnecessary increase in the group read count GCT1 is suppressed, it is possible to prevent a reliability management operation from being performed frequently. For example, in the case where sequential read operations for the memory regions MR1 to MR4 are continuously performed, the group read count GCT1 may be increased in response to a read access to the first memory region MR1 after all the region read counts CT1 to CT4 reach the first threshold value TH1. At this time, the region read counts CT2 to CT4 of the remaining memory regions MR2 to MR4 may be reduced. Therefore, the group read count GCT1 may be increased in response to a read access to the first memory region MR1 after read accesses to the remaining memory regions MR2 to MR4 are respectively performed. Namely, since the group read count GCT1 is not increased each time each of the memory regions MR1 to MR4 is read-accessed, a reliability management operation based on the group read count GCT1 may be suppressed from being performed too frequently.

Figure 5:
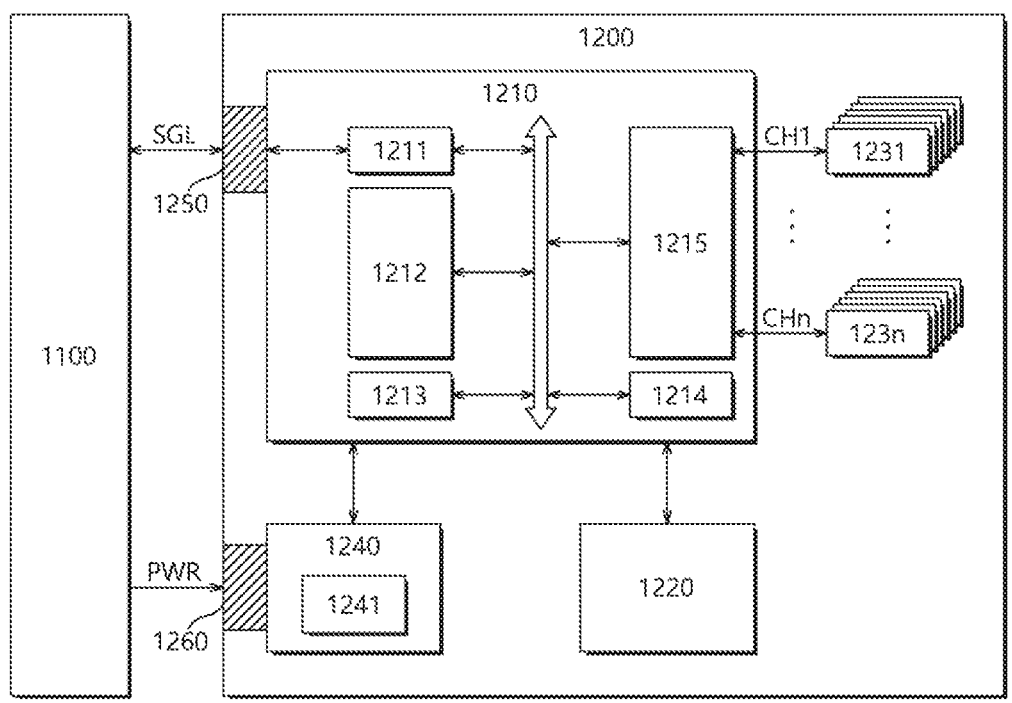
FIG. 5 is a diagram illustrating a data processing system including a solid state drive (SSD) in accordance with an embodiment.

FIG. 5 is a diagram illustrating a data processing system 1000 including a solid state drive (SSD) 1200 in accordance with an embodiment. Referring to FIG. 5, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The control unit 1212 may include the count management circuit 111 and the reliability management circuit 112 shown in FIG. 1. The control unit 1212 may operate in the same manner as the count management circuit 111 and the reliability management circuit 112.

The ECC unit 1214 may generate the parity data of the count management circuit 111 and the reliability management circuit 112 data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123*n*. Further, the buffer memory device 1220 may temporarily store the data read from at least one of the nonvolatile memory devices 1231 to 123*n*. The data temporarily stored in the buffer memory device 1220 may be transmitted to the host device 1100 or at least one of the nonvolatile memory devices 1231 to 123*n* according to control of the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 6:
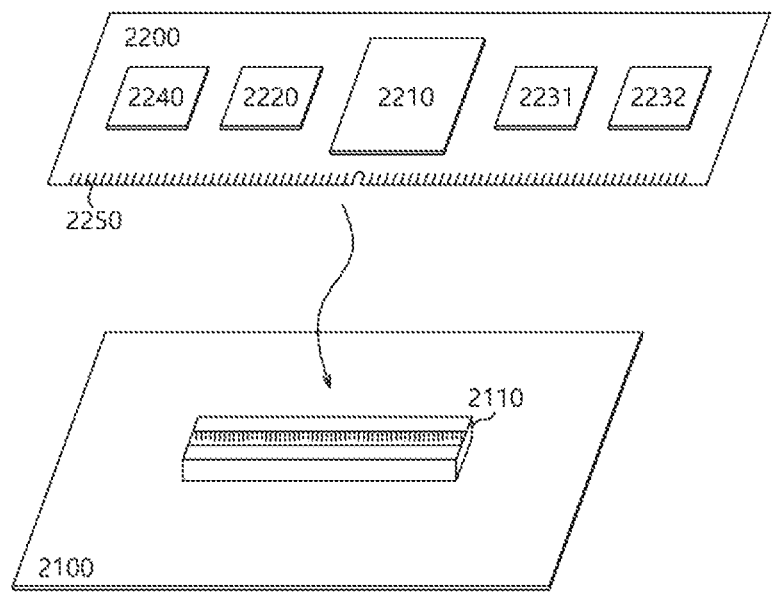
FIG. 6 is a diagram illustrating a data processing system including a memory system in accordance with an embodiment.

FIG. 6 is a diagram illustrating a data processing system 2000 including a memory system 2200 in accordance with an embodiment. Referring to FIG. 6, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 5.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 7:
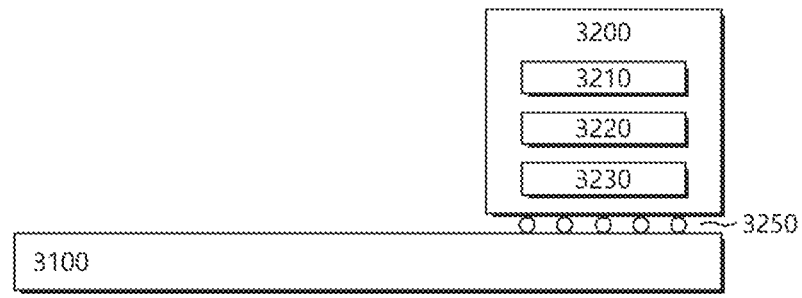
FIG. 7 is a diagram illustrating a data processing system including a memory system in accordance with an embodiment.

FIG. 7 is a diagram illustrating a data processing system 3000 including a memory system 3200 in accordance with an embodiment. Referring to FIG. 7, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 5.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 8:
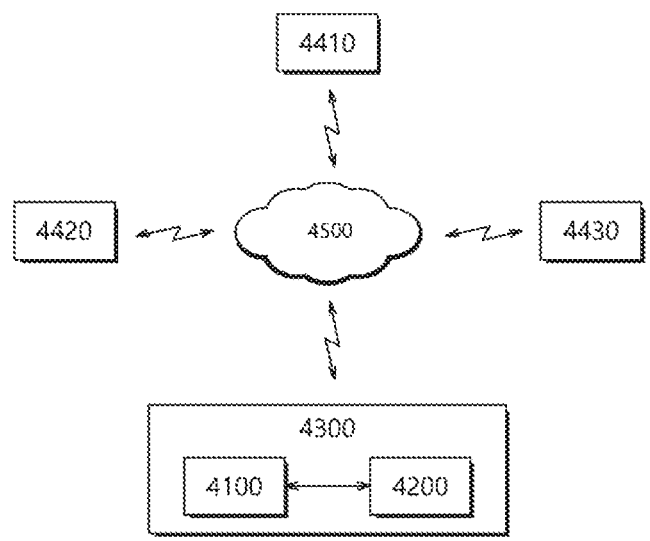
FIG. 8 is a diagram illustrating a network system including a memory system in accordance with an embodiment.

FIG. 8 is a diagram illustrating a network system 4000 including a memory system 4200 in accordance with an embodiment. Referring to FIG. 8, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 1200 shown in FIG. 5, the memory system 2200 shown in FIG. 6 or the memory system 3200 shown in FIG. 7.

Figure 9:
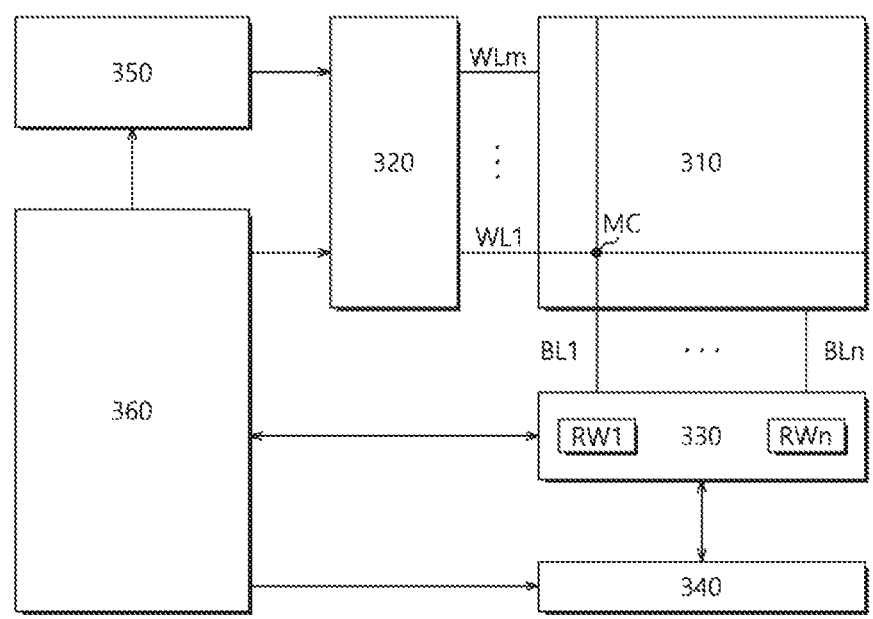
FIG. 9 is a block diagram illustrating a nonvolatile memory device included in a memory system in accordance with an embodiment.

FIG. 9 is a block diagram illustrating a nonvolatile memory device 300 included in a memory system in accordance with an embodiment. Referring to FIG. 9, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the memory system and the operating method thereof described herein should not be limited based on the described embodiments.

What is claimed is:

1. A memory system comprising:
a storage medium including a memory region group having a plurality of memory regions;
a memory configured to store a plurality of region read counts respectively corresponding to the plurality of memory regions and a group read count corresponding to the memory region group;
a count management circuit configured to, when a first memory region among the plurality of memory regions is read-accessed, based on a first region read count corresponding to the first memory region among the plurality of region read counts, increase the group read count and reduce remaining region read counts other than the first region read count among the plurality of region read counts; and
a reliability management circuit configured to perform a reliability management operation for the memory region group, based on the group read count.

2. The memory system according to claim 1, wherein the count management circuit increases the group read count and reduces the remaining region read counts when the first memory region is read-accessed and the first region read count has reached a first threshold value.

3. The memory system according to claim 1, wherein the count management circuit increases the first region read count when the first memory region is read-accessed and the first region read count has not reached the first threshold value.

4. The memory system according to claim 3, wherein the count management circuit maintains the group read count and the remaining region read counts when increasing the first region read count.

5. The memory system according to claim 1, wherein the count management circuit reduces the remaining region read counts by reducing the plurality of region read counts and increasing the first region read count.

6. The memory system according to claim 1, wherein the count management circuit increases the group read count by an adjustment value and reduces the remaining region read counts by the adjustment value.

7. The memory system according to claim 1, wherein the reliability management circuit performs the reliability management operation in the case where the group read count has reached a second threshold value.

8. The memory system according to claim 1, wherein, when performing the reliability management operation, the reliability management circuit moves valid data stored in the plurality of memory regions to one or more other memory regions.

9. The memory system according to claim 1, wherein the count management circuit initializes the plurality of region read counts and the group read count after the reliability management operation is performed.

10. The memory system according to claim 1,
wherein the storage medium comprises a plurality of nonvolatile memory devices which are accessible in parallel, and
wherein the plurality of memory regions are included in the plurality of nonvolatile memory devices, respectively.

11. A method for operating a memory system, comprising:
read-accessing a first memory region among a plurality of memory regions included in a memory region group;
based on a first region read count corresponding to the first memory region among a plurality of region read counts respectively corresponding to the plurality of memory regions, increasing a group read count of the memory region group and reducing remaining region read counts other than the first region read count among the plurality of region read counts; and
performing a reliability management operation for the memory region group, based on the group read count.

12. The method according to claim 11, wherein the increasing of the group read count and reducing of the remaining region read counts comprises increasing the group read count and reducing the remaining region read counts when the first memory region is read-accessed and the first region read count has reached a first threshold value.

13. The method according to claim 1, further comprising increasing the first region read count when the first memory region is read-accessed and the first region read count has not reached the first threshold value.

14. The method according to claim 13, further comprising maintaining the group read count and the remaining region read counts when increasing the first region read count.

15. The method according to claim 11, wherein the reducing of the remaining region read counts comprises:
reducing the plurality of region read counts; and
increasing the first region read count.

16. The method according to claim 11, wherein the increasing of the group read count and reducing of the remaining region read counts comprises increasing the group read count by an adjustment value and reducing the remaining region read counts by the adjustment value.

17. The method according to claim 11, wherein the performing of the reliability management operation comprises performing the reliability management operation in the case where the group read count has reached a second threshold value.

18. The method according to claim 11, wherein the performing of the reliability management operation comprises moving valid data stored in the plurality of memory regions to one or more other memory regions.

19. The method according to claim 11, further comprising initializing the plurality of region read counts and the group read count after the reliability management operation is performed.

20. A memory system comprising:
a memory device including at least a memory region group having first and second memory regions; and
a controller configured to:
increase a group read count for the memory region group by a preset amount while decreasing a second region read count for the second memory region by the preset amount when a first region read count for the first memory region reaches a first threshold due to a read-access to the first memory region; and
control the memory device to move valid data of the memory region group into another memory region when the group read count reaches a second threshold.

* * * * *